United States Patent
Kang et al.

(10) Patent No.: US 8,639,460 B2
(45) Date of Patent: Jan. 28, 2014

(54) APPARATUS FOR ESTIMATING OPEN CIRCUIT VOLTAGE OF BATTERY, APPARATUS FOR ESTIMATING STATE OF CHARGE OF BATTERY, AND METHOD FOR CONTROLLING THE SAME

(75) Inventors: Jung-Soo Kang, Daejeon (KR);
Do-Youn Kim, Daejeon (KR);
Chang-Gi Jung, Daejeon (KR);
Do-Yang Jung, Gyeonggi-do (KR)

(73) Assignee: LG Chem, Ltd., Seoul (KR)

( * ) Notice: Subject to any disclaimer, the term of this patent is extended or adjusted under 35 U.S.C. 154(b) by 43 days.

(21) Appl. No.: 13/440,410

(22) Filed: Apr. 5, 2012

(65) Prior Publication Data

US 2012/0191390 A1 Jul. 26, 2012

Related U.S. Application Data

(63) Continuation of application No. 12/602,935, filed as application No. PCT/KR2008/004926 on Aug. 22, 2008, now Pat. No. 8,175,826.

(30) Foreign Application Priority Data

Aug. 22, 2007 (KR) .................. 10-2007-0084535

(51) Int. Cl.
*G01R 31/36* (2006.01)
(52) U.S. Cl.
CPC ...................................... *G01R 31/36* (2013.01)
USPC .......................................................... 702/63
(58) Field of Classification Search
USPC ............................ 702/53, 130, 182–185, 188
See application file for complete search history.

(56) References Cited

U.S. PATENT DOCUMENTS

| 4,564,798 | A | 1/1986 | Young |
| 6,490,484 | B2 | 12/2002 | Dooley et al. |
| 6,531,875 | B2 | 3/2003 | Satake |
| 2003/0169049 | A1 | 9/2003 | Kawaguchi et al. |
| 2005/0134282 | A1* | 6/2005 | Averbuch ...................... 324/426 |
| 2005/0275407 | A1 | 12/2005 | Yumoto et al. |

FOREIGN PATENT DOCUMENTS

| EP | 1 555 537 A1 | 7/2005 |
| JP | 56-153303 A | 11/1981 |
| JP | 2007-174865 A | 7/2007 |
| KR | 10-0740099 B1 | 7/2007 |

OTHER PUBLICATIONS

KIPO International Search Report for Appl. No. PCT/KR2008/004926 dated Dec. 31, 2008.

* cited by examiner

*Primary Examiner* — Edward Raymond
(74) *Attorney, Agent, or Firm* — Birch, Stewart, Kolasch & Birch, LLP

(57) ABSTRACT

An apparatus for estimating an OCV of a battery includes a voltage sensing unit for measuring a battery output voltage; a temperature sensing unit for measuring a battery temperature; a data storing unit for periodically receiving the battery output voltage and temperature data from the sensing units and storing the data in a memory; an OCV variation estimating unit for calculating an OCV variation from a varying pattern of battery output voltages measured in the past and at the present, stored in the memory, by applying a mathematical model defining a correlation between the varying pattern and the OCV variation, and estimating an OCV at a current stage by reflecting a correction factor corresponding to the battery temperature on the calculated OCV variation; and an OCV estimating unit for estimating an OCV at the current stage by reflecting the estimated OCV variation on the OCV estimated at a last stage.

19 Claims, 8 Drawing Sheets

Figure 8

| Case | Temperature | Measured Rest OCV | Estimated OCV | Voltage error | Measured rest SOC | Estimated SOC | SOC error | Rest Term(sec) |
|---|---|---|---|---|---|---|---|---|
| 1 | 31 | 178.1 | 177.0113166 | 1.09 | 47.691 | 46 | 1.691 | |
| 2 | 31 | 174.6 | 174.3355 | 0.26 | 42.387 | 42 | 0.387 | |
| 3 | 31.5 | 170.3 | 170.8037797 | -0.50 | 36.31 | 37 | -0.69 | |
| 4 | 31.5 | 169.6 | 170.0762963 | -0.48 | 35.99 | 36 | -0.01 | |
| 5 | 31 | 172.8 | 174.3354831 | -1.54 | 39.789 | 42 | -2.211 | |
| 6 | 31 | 175.2 | 176.0238864 | 0.82 | 43.272 | 44.5 | 1.228 | |
| 7 | 31 | 175.2 | 175.0903928 | -0.49 | 43.272 | 44 | -0.728 | 25C |
| 8 | 31 | 179.1 | 180.7407063 | -1.65 | 49.283 | 52 | -2.717 | |
| 9 | 30.5 | 181 | 182.2019514 | -1.20 | 52.416 | 54.5 | -2.084 | |
| 10 | 30.5 | 180.3 | 180.156521 | 0.14 | 51.239 | 51 | 0.239 | |
| 11 | 32 | 173.3 | 171.8703732 | 1.43 | 40.529 | 38.5 | 2.029 | |
| 12 | 32 | 171.3 | 172.2256085 | -0.93 | 37.703 | 39 | -1.297 | |
| 13 | 32 | 176.6 | 176.0049002 | 0.60 | 45.401 | 44.5 | 0.901 | |
| 14 | 33 | 172.9 | 172.8966874 | 0.00 | 40.005 | 40 | 0.005 | |
| 15 | 33 | 168.1 | 168.5547109 | -0.45 | 33.393 | 34 | -0.607 | |
| 16 | 33 | 167.4 | 168.1807367 | -0.78 | 32.465 | 33.5 | -1.035 | |
| 17 | 33 | 171 | 172.1917866 | -1.19 | 37.334 | 39 | -1.666 | |
| 18 | 33 | 173.5 | 174.2831635 | -0.78 | 40.865 | 42 | -1.135 | |
| 19 | 32.5 | 173.5 | 174.3022193 | -0.80 | 40.838 | 42 | -1.162 | |
| 20 | 32 | 177.7 | 179.2142247 | -1.51 | 47.096 | 49.5 | -2.404 | |
| 21 | 32 | 179.8 | 180.7272646 | -0.93 | 50.456 | 52 | -1.544 | |
| 22 | 32 | 178.9 | 178.9039669 | 0.00 | 48.994 | 49 | -0.006 | |
| 23 | 33 | 171.6 | 170.3965187 | 1.20 | 38.169 | 36.5 | 1.669 | |
| 24 | 34 | 169.6 | 170.3449825 | -0.74 | 35.482 | 36.5 | -1.018 | |
| 25 | 34 | 168.8 | 169.88013.7 | 0.18 | 35.754 | 36 | 0.246 | |
| 26 | 25 | 174.5 | 173.8391989 | 0.66 | 42.457 | 41.5 | 0.957 | |
| 27 | 25 | 168.9 | 168.8504879 | 0.05 | 34.642 | 34.5 | 0.142 | |
| 28 | 26 | 176.2 | 177.2510825 | -1.05 | 44.903 | 46.5 | -1.597 | |
| 29 | 26 | 180.6 | 182.4235332 | -1.82 | 51.858 | 55 | -3.142 | |
| 30 | 26 | 182.2 | 181.8552234 | 0.34 | 54.605 | 54 | 0.605 | 50C |
| 31 | 27.5 | 173.8 | 174.2923567 | -0.4923566652 | 41.288 | 42 | -0.712 | |
| 32 | 27.5 | 172.8 | 172.1936743 | 0.606325863 | 39.857 | 39 | 0.857 | |
| 33 | 28 | 166.7 | 166.6716504 | 0.028349636 | 31.537 | 31.5 | 0.037 | |
| 34 | 27.5 | 174.5 | 175.6517852 | -1.151785151 | 42.303 | 44 | -1.897 | |
| 35 | 27.5 | 179.1 | 180.729092 | -1.629092047 | 49.325 | 52 | -2.675 | |
| 36 | 26.5 | 180.8 | 180.7014576 | 0.098542421 | 52.166 | 52 | 0.166 | |
| 37 | 28.5 | 172.1 | 171.5775426 | 0.477542835 | 38.627 | 39.5 | -0.873 | |
| 38 | 28 | 172.3 | 172.564243 | -0.264242967 | 39.127 | 39.5 | -0.373 | |
| | | | | | | RMSE | 1.40776601 | |
| | | | | | | MAE | 1.14437838 | |

APPARATUS FOR ESTIMATING OPEN CIRCUIT VOLTAGE OF BATTERY, APPARATUS FOR ESTIMATING STATE OF CHARGE OF BATTERY, AND METHOD FOR CONTROLLING THE SAME

This application is a Continuation of co-pending application Ser. No. 12/602,935 filed Dec. 3, 2009, which is the National phase of PCT International Application No. PCT/KR2008/004926 filed on Aug. 22, 2008. This application also claims priority to Patent Application No. 10-2007-0084535 filed in the Republic of Korea on Aug. 22, 2007, all of which are hereby expressly incorporated by reference into the present application.

TECHNICAL FIELD

The present invention relates apparatus and method for estimating an open circuit voltage (OCV) and a state of charge (SOC) of a battery, and more particularly to apparatus and method for estimating an open circuit voltage (OCV) of a battery according to a charge pattern of a battery output voltage and then estimating a state of charge (SOC) of the battery based on the estimated OCV and a battery temperature.

BACKGROUND ART

Generally, a rechargeable battery is mounted to an electric car or a portable electronic device such as a video camera, a mobile phone, a portable PC, PMP and a MP3 player, so the portable electronic device or the electric car is operated using the power output from the battery.

In case a battery is used for a portable electronic device, the battery is recharged using a separate charging unit. In case a battery is used for an electric car, the battery is recharged using electricity generated by a rotational force of a driving wheel while the car is running.

Meanwhile, if a battery is connected to a load to initiate discharging, a terminal voltage between an anode and a cathode is gradually decreased. Also, if the terminal voltage reaches a certain limit, the terminal voltage between the cathode and the anode is rapidly lowered to a discharge end voltage, and after that, the discharging capability is lost. If the battery is discharged below the discharge end voltage, chemical reaction is caused between an electrolyte and an electrode plate, thereby damaging the electrode plate that generates electric current. If this phenomenon is repeated, the battery may lose its function or suffer from a shortened life cycle.

Thus, when using a battery, it is very important to charge the battery at a suitable point by exactly checking SOC (State Of Charge) of the battery and also to prevent the battery from being discharged to a discharge end voltage. In particular, in case of an electric car or a hybrid car, SOC of a battery should be accurately checked so as to prevent in advance the car from abruptly stopping while running and also to stably supply power to a motor of the car. However, since the battery characteristic is changed non-linearly (for example, varying according to temperature, discharge or the like), it is difficult to exactly measure SOC of the battery.

There have been frequently used a method for estimating SOC of a battery according to OCV (Open Circuit Voltage) of the battery and a method for estimating SOC of a battery based on a discharged current of the battery.

In the former method, a varying pattern of OCV is prepared in the form of a look-up table for each SOC in advance, and then a SOC is mapped from the look-up table according to an output voltage of the battery. However, in the step of charging or discharging the battery, there occurs an error between an actual voltage and a measured voltage due to IR drop, so it is not accurate to estimate SOC of a battery based on a battery voltage.

For reference, IR drop means that a voltage is rapidly changed when a battery is connected to a load and initiates charging or discharging. That is to say, the battery voltage is rapidly lowered when the battery initiates discharging, while the voltage is rapidly increased when the battery initiates charging.

In the latter method, SOC is estimated through a current load of the battery, namely a current capacity calculated by accumulating currents flowing toward the load. However, this method exhibits deteriorated accuracy in estimation of SOC as time goes since a measurement error occurring at measurement of electric current is also accumulated.

Accordingly, in recent days, various methods for correcting SOC of a battery have been suggested to solve the above conventional problems. Such methods adopt complicated mathematical models, which however require a lot of time for estimation of SOC of a battery and also need high-tech hardware for executing complicated operations.

DISCLOSURE

Technical Problem

The present invention is designed in consideration of the above problems, and therefore it is an object of the invention to provide an apparatus capable of correcting a measurement error of battery output voltage, caused by IR drop, and also easily and accurately estimating an open circuit voltage (OCV) and a state of charge (SOC) of a battery only using the battery output voltage where measurement errors are not accumulated, and also to provide a method for controlling the same.

Technical Solution

In order to accomplish the above object, the present invention provides an apparatus for estimating an OCV (Open Circuit Voltage) of a battery, comprising: a voltage sensing unit for measuring an output voltage of a battery; a temperature sensing unit for measuring a temperature of the battery; a data storing unit for periodically receiving the battery output voltage and the temperature data from the voltage sensing unit and the temperature sensing unit and then storing the battery output voltage and the temperature data in a memory; an OCV variation estimating unit for calculating an OCV variation from a varying pattern of battery output voltages measured in the past and at the present, stored in the memory, by applying a mathematical model that defines a correlation between the varying pattern of battery output voltages and the OCV variation, and then estimating an OCV at a current stage by reflecting a correction factor corresponding to the battery temperature on the calculated OCV variation; and an OCV estimating unit for estimating an OCV of the battery at the current stage by reflecting the estimated OCV variation on the OCV estimated at a last stage.

In another aspect of the present invention, there is also provided an apparatus for estimating a SOC (State Of Charge) of a battery, which further comprises a SOC estimating unit for mapping SOC of the battery corresponding to the estimated OCV and the battery temperature from the SOC information of each temperature and each OCV and then outputting the SOC.

Preferably, the OCV estimating unit corrects the OCV by adding a difference between a weight mean value for the battery output voltages of the past and the present and the OCV of the last stage to the estimated OCV of the current stage, the weight mean value being increased as a measurement point of the battery output voltage is earlier. Here, the battery output voltage of the past may be a battery output voltage of the last stage.

In the present invention, the estimated OCV variation may be calculated by multiplying the calculated OCV variation by the correction factor.

In the present invention, the battery output voltage of the variation pattern may include at least battery output voltages ($V_n$, $V_{n-1}$ and $V_{n-2}$) measured at a current stage, a last stage and the stage before last.

Preferably, the mathematical model is defined by mathematical operation between a battery output voltage variation between the current stage and the last stage and a pattern function defined by each output voltage of the battery output voltage varying pattern.

In the present invention, the correction factor is preferably calculated by inputting the temperature of the battery into a mathematical model defining a battery temperature (T) as an input variable and a correction factor of the battery OCV variation as an output variable.

In order to accomplish the above object, the present invention also provides a method for estimating an OCV of a battery, comprising: periodically obtaining output voltage and temperature data of a battery; calculating an OCV variation from a varying pattern of battery output voltages measured at the present and in the past by applying a mathematical model that defines a correlation between the varying pattern of battery output voltages and the OCV variation, and estimating an OCV variation at a current stage by reflecting a correction factor corresponding to the battery temperature on the calculated OCV variation; and estimating a battery OCV at the current stage by reflecting the estimated OCV variation on a battery OCV estimated at a last stage.

In another aspect of the present invention, there is also provided a method for estimating SOC of a battery, which further comprises the step of mapping SOC of the battery corresponding to the estimated OCV and the battery temperature with reference to the SOC information of each temperature and each OCV and then outputting the SOC.

The above object may also be accomplished by a hardware module such as a microprocessor that executes each step required for estimating an OCV or SOC of a battery.

In order to accomplish the above object, the present invention also provides a hardware module for estimating an OCV of a battery, which executes: a process of calculating an OCV variation from a varying pattern of battery output voltages measured at the present and in the past, stored in a memory, by applying a mathematical model that defines a correlation between the varying pattern of battery output voltages and the OCV variation; a process of estimating an OCV variation at a current stage by reflecting a correction factor corresponding to a battery temperature on the calculated OCV variation; and a process of estimating a battery OCV at the current stage by reflecting the estimated OCV variation on a battery OCV estimated at a last stage.

In another aspect of the present invention, there is also provided a hardware module for estimating SOC of a battery, which further executes a process of mapping SOC corresponding to the estimated OCV and the battery temperature from previously provided SOC information of each temperature and each OCV and then outputting the SOC.

DESCRIPTION OF DRAWINGS

These and other features, aspects, and advantages of preferred embodiments of the present invention will be more fully described in the following detailed description, taken accompanying drawings. In the drawings:

FIG. 8 is a table showing battery temperatures, measured OCV, estimated OCV, differences (error values) between the measured OCV and the estimated OCV, measured SOC, estimated SOC, and differences (error values) between the measured SOC and the estimated SOC, in a comparative and analytic manner.

REFERENCE NUMERALS OF ESSENTIAL PARTS IN THE DRAWINGS

| | |
|---|---|
| 100: | battery |
| 200: | apparatus for estimating OCV and SOC of battery |
| 210: | voltage sensing unit |
| 220: | temperature sensing unit |
| 230: | memory |
| 240: | microprocessor |
| 240': | battery parameter estimating module |
| 241: | data storing unit |
| 242: | OCV variation estimating unit |
| 243: | OCV estimating unit |
| 244: | SOC estimating unit |
| 300: | load |
| 310: | battery management system |

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
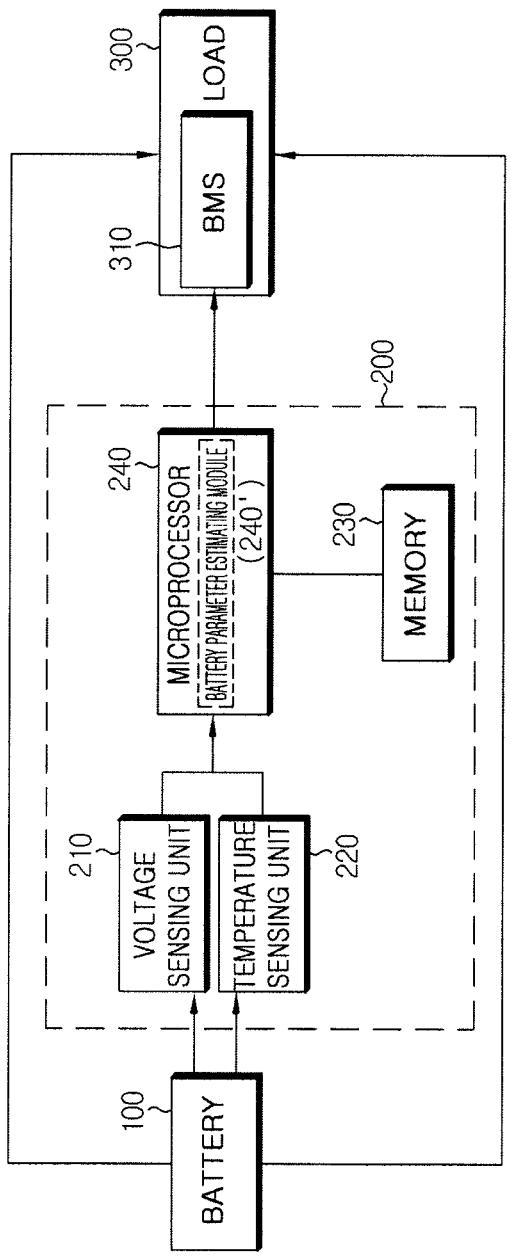
FIG. 1 is a block diagram showing an apparatus for estimating an open circuit voltage (OCV) of a battery and an apparatus for estimating a state of charge (SOC) of a battery using the same according to an embodiment of the present invention.

FIG. 1 is a block diagram schematically showing an apparatus for estimating an open circuit voltage (OCV) and a state of charge (SOC) of a battery according to an embodiment of the present invention.

Referring to FIG. 1, the apparatus 200 for estimating OCV and SOC of a battery according to the present invention includes a voltage sensing unit 210, a temperature sensing unit 220, a memory 230, and a microprocessor 240. Preferably, the apparatus 200 is connected between a battery 100 and a BMS (Battery Management System) 310 of a load 300 to which power is supplied from the battery 100.

The voltage sensing unit 210 periodically measures an output voltage of the battery 100 and outputs the output voltage to the microprocessor 240.

The temperature sensing unit 220 periodically measures a temperature of the battery 100 and outputs the temperature to the microprocessor 240.

The memory 230 stores battery SOC (State Of Charge) at each temperature and each OCV, obtained by experiments in advance, and also stores output voltage and temperature data of the battery, periodically obtained from the battery 100.

Here, the battery SOC at each temperature and each OCV is stored in a non-volatile area of the memory 230. Thus, the data relating to battery SOC at each temperature and each OCV is not lost though power is not supplied to the memory 230.

The output voltage data and the temperature data, measured by the voltage sensing unit 210 and the temperature sensing unit 220, are stored in a volatile area of the memory 230. The output voltage data and the temperature data of the battery are stored and kept only when power is supplied to the memory 230.

The microprocessor 240 receives output voltage and temperature data from the voltage sensing unit 210 and the temperature sensing unit 220, stores them in the memory 230, and executes a battery parameter estimating module 240' that is a program algorithm for estimating OCV and SOC of a battery. Configuration and operation of the battery parameter estimating module 240' will be explained later in more detail.

The kind of battery 100 is not specially limited, and it may adopt a lithium ion battery, a lithium polymer battery, a nickel-cadmium battery, a nickel-hydrogen battery, or a nickel-zinc battery, which is rechargeable and whose SOC should be considered.

The kind of load 300 is not specially limited, and it may adopt a portable electronic device such as a video camera, a mobile phone, a portable PC, PMP, and a MP3 player; a motor of an electric car or a hybrid car; or a DC-to-DC converter.

Meanwhile, the load 300 is provided with a battery management system (BMS) 310. The BMS 310 plays a role of checking an abnormal state of the battery 100 and displaying OCV and/or SOC of the battery through a display to a user.

Figure 2:
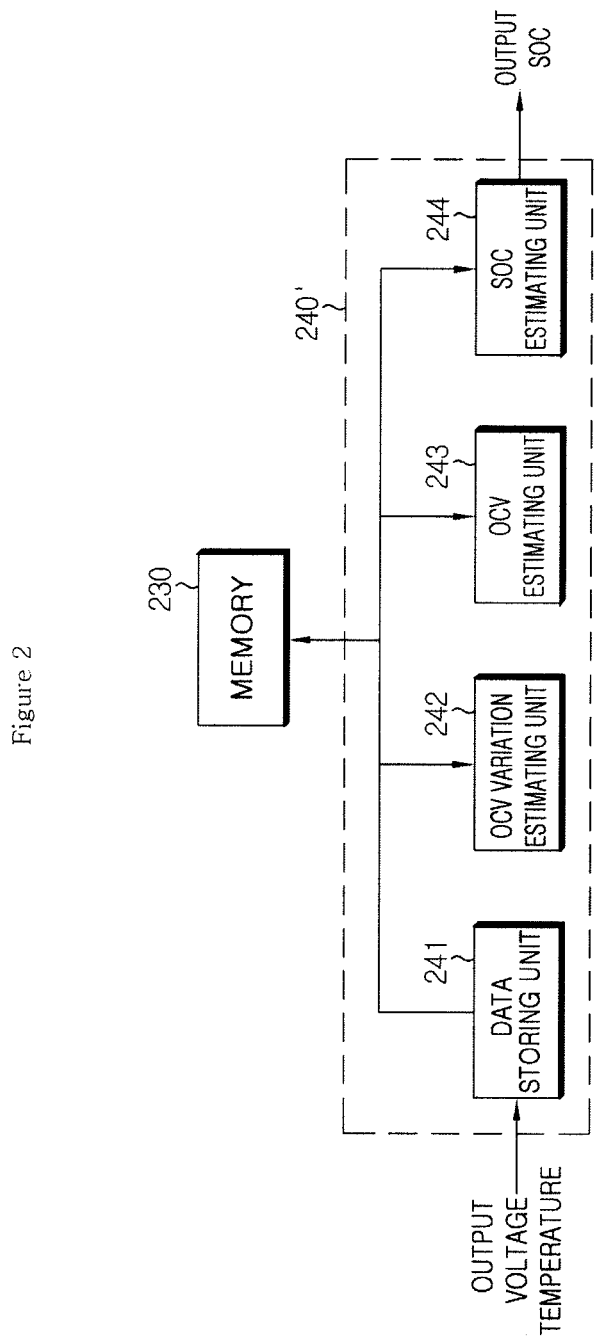
FIG. 2 is a block diagram for illustrating functions of a battery parameter estimating module according to a preferred embodiment of the present invention.

FIG. 2 is a block diagram for illustrating functions of the battery parameter estimating module 240' according to a preferred embodiment of the present invention.

Referring to FIG. 2, the battery parameter estimating module 240' includes a data storing unit 241, an OCV variation estimating unit 242, an OCV estimating unit 243 and a SOC estimating unit 244.

The data storing unit 241 periodically receives output voltage and temperature data of a battery from the voltage sensing unit 210 and the temperature sensing unit 220, shown in FIG. 1, and stores the data in a temporary working area that is a non-volatile area of the memory 230.

The OCV variation estimating unit 242 estimates an OCV variation on the basis of OCV at a last stage using a varying pattern of a battery output voltage so as to estimate OCV of the battery at a current stage. That is to say, the OCV variation estimating unit 242 estimates how much the OCV of the battery at the current stage is varied on the basis of the OCV at the last stage.

In more detail, the OCV variation estimating unit 242 reads a battery output voltage at the current stage, a battery output voltage at the last stage, and a battery temperature at the current stage from the memory 230. Then, the OCV variation estimating unit 242 estimates an OCV variation $\Delta OCV_n$ by using the following equation 1.

$$\Delta OCV_n = OCV_n - OCV_{n-1} = G(V) \times F(T) \quad \text{Equation 1}$$

In the equation 1, G(V) is an OCV variation calculating function for mapping a battery output voltage variation '$V_n - V_{n-1}$' between the current stage and the last stage into an OCV variation $\Delta OCV_n$, and F(T) is an OCV correcting function for correcting the OCV variation $\Delta OCV_n$ according to the battery temperature by reflecting an OCV change effect according to temperature.

G(V) is a function that converts a variation of the battery output voltage into an OCV variation by correcting an error (a difference between the measured voltage and the actual voltage) of the battery output voltage, caused by IR drop, without using the variation of the battery output voltage as it is. That is to say, if the battery output voltage variation tends to increase rather than a former one, G(V) decreases the variation of the battery output voltage and then outputs it as a battery OCV variation. Also, if the battery output voltage variation tends to be kept constantly, G(V) outputs the variation of the battery output voltage as a battery OCV variation. In addition, if the battery output voltage tends to decrease rather than a former one, G(V) increases the battery output voltage variation a little and then outputs it as the battery OCV variation.

G(V) can be obtained by mathematically modeling a correlation between a varying pattern of the battery output voltage and a corresponding OCV variation under a specific temperature condition. As an example, a function for the mathematical modeling can be obtained after analyzing a correlation between a varying pattern of battery output voltages $V_n$, $V_{n-1}$ and $V_{n-2}$ at a current stage, a last stage and the stage before last and a corresponding OCV variation $\Delta OCV_n$ under an experiment condition that allows measurement of a battery output voltage and a battery OCV. The number of battery output voltages that configure a varying pattern of the battery output voltage can be extended to 4 or more.

G(V) may be generalized and defined as in the following equation 2.

$$G(V) = (V_n - V_{n-1}) \times g(V_n, V_{n-1}, V_{n-2}, \ldots) \quad \text{Equation 2}$$

Here, $g(V_n, V_{n-1}, V_{n-2}, \ldots)$ is a pattern function that defines a varying pattern of battery output voltage. The symbol '...' means that a pattern function can be defined using three or more battery output voltages, including the battery output voltage measured at a current stage. The pattern function is defined by analyzing a correlation between a plurality of experimentally obtained battery output voltage variations and an OCV variation. As an example, the function g can be defined as a relative ratio of the output voltage variation at the last stage to the output voltage variation at the current stage. The present invention is however not limited to the detailed equations of the pattern function.

An internal battery resistance varies depending on temperature. If the internal resistance of battery varies, the battery output voltage pattern and the battery OCV variation are also changed in spite of the same charging or discharging condition. In this consideration, F(T) corrects the OCV variation, calculated by G(V), according to the temperature condition. In other words, F(T) is a function of correcting the OCV variation estimated by G(V) in case the temperature of battery is different from the temperature set as a calculation condition of G(V). F(T) may be obtained by analyzing a correlation between the varying pattern of the battery output voltage and the battery OCV variation with changing temperature at regular intervals. That is to say, F(T) may be calculated by mathematical modeling that quantitatively measures a variation width of the battery OCV variation $\Delta OCV_n$ while setting experiment conditions such that the battery output voltage pattern is identical at each temperature measured at regular intervals, for example 1° C., and uses the temperature T and the variation width of $\Delta OCV_n$ as an input variable and an output variable, respectively. F(T) obtained as above becomes a function for outputting a correction factor of battery OCV variation by using the temperature T of battery as an input variable. For simplification of the calculation, correction factors of every T value are configured as a look-up table and then recorded in the memory 230, and the correction factor of each temperature can be referred to when a battery OCV variation is calculated.

The OCV estimating unit 243 reads $n-1^{th}$ OCV, estimated at the last stage, from the memory 230, and then estimates $n^{th}$ OCV by adding the OCV variation $\Delta OCV_n$, estimated by the OCV variation estimating unit 242, to the $n-1^{th}$ OCV.

Preferably, the OCV estimating unit 243 calculates a weight mean value $V_{n(meanvalue)}$ between the battery output voltage $V_n$ at the current stage and the battery output voltage measured at the last stage using the following equation 3.

$$V_{n(meanvalue)} = (A_1 * V_1 + A_2 * V_2 + \ldots + A_{n-1} * V_{n-1} + A_n * V_n) / A_{total}$$

$$A_{total} = A_1 + A_2 + A_3 + \ldots + A_n \qquad \text{Equation 3}$$

In the above equation 3, $A_k$ is decreased as k increases. For example, in case n=100, $A_k$ may have a value starting from 100 and decreased 1 by 1. As an alternative example, $A_1 * V_1 + A_2 * V_2 + \ldots + A_{k-2} * V_{k-2}$ ($3 \le k \le n$) may be excluded in the equation 3. In this case, the tendency of $A_k$ is also maintained identically as above. For example, in case k=n, $A_1 * V_1 + A_2 * V_2 + \ldots + A_{n-2} * V_{n-2}$ is considered as 0, and a relatively greater value may be endowed to $A_{n-1}$ rather than $A_n$. For example, 90 and 10 may be endowed to $A_{n-1}$ and $A_n$, respectively.

The OCV estimating unit 243 may correct the estimated value of the $n^{th}$ OCV once more by making an addition correction in a way of adding a difference value between the calculated weight mean value $V_{n(meanvalue)}$ and the $OCV_{n-1}$ estimated at the last stage to the estimated $n^{th}$ OCV. If an additional correction is made to the $n^{th}$ OCV by a weight means value, it is possible to reduce an error of the estimated $n^{th}$ OCV though an output voltage from the battery 100 is rapidly changed.

The SOC estimating unit 244 maps SOC (State of Charge) of a battery corresponding the $n^{th}$ OCV estimated by the OCV estimating unit 243 and a temperature measured when the $n^{th}$ OCV was estimated, from the SOC information of each temperature and each OCV stored in the memory 230, and then outputs it.

The SOC information of each temperature and each OCV may be configured into a look-up table format as shown in the following table 1.

TABLE 1

| SOC | ... | −30° C. | 0° C. | 30° C. | ... |
|---|---|---|---|---|---|
| 0% | ... | 2.7 V | 2.78 V | 2.77 V | ... |
| 1% | ... | 2.82 V | ... | ... | ... |
| 2% | ... | 2.97 V | ... | ... | ... |
| . | . | . | . | . | . |
| . | . | . | . | . | . |
| . | . | . | . | . | . |

The SOC estimating unit 244 estimates $n^{th}$ SOC of a battery by mapping the estimated $n^{th}$ OCV and temperature from the look-up table where the SOC information of each temperature and each OCV is recorded as in Table 1. For example, assuming that $n^{th}$ OCV is 2.97 and a temperature of battery measured when estimating the $n^{th}$ OCV is −30° C., it would understood that $n^{th}$ SOC of the battery is 2%.

The SOC estimating unit 244 outputs the mapped battery SOC information to the BMS 310. Then, the BMS 310 may provide the battery SOC information to a user through a display or the like or utilize the battery SOC information as data for controlling operations of a battery such as charge initiation or discharge stop of the battery.

The battery parameter estimating module 240' explained above may be set to calculate and output only an OCV of a battery, or set to estimate even SOC of a battery by using the estimated OCV. In case the battery parameter estimating module 240' is set to estimate only a battery OCV, the microprocessor 240 that executes the battery parameter estimating module 240' may be called a hardware module for estimating an OCV of a battery. In addition, in case it is set that the OCV estimated by the battery parameter estimating module 240' is used for estimating even SOC of a battery, the microprocessor 240 that executes the battery parameter estimating module 240' may be called a hardware module for estimating SOC of battery.

Figure 3:
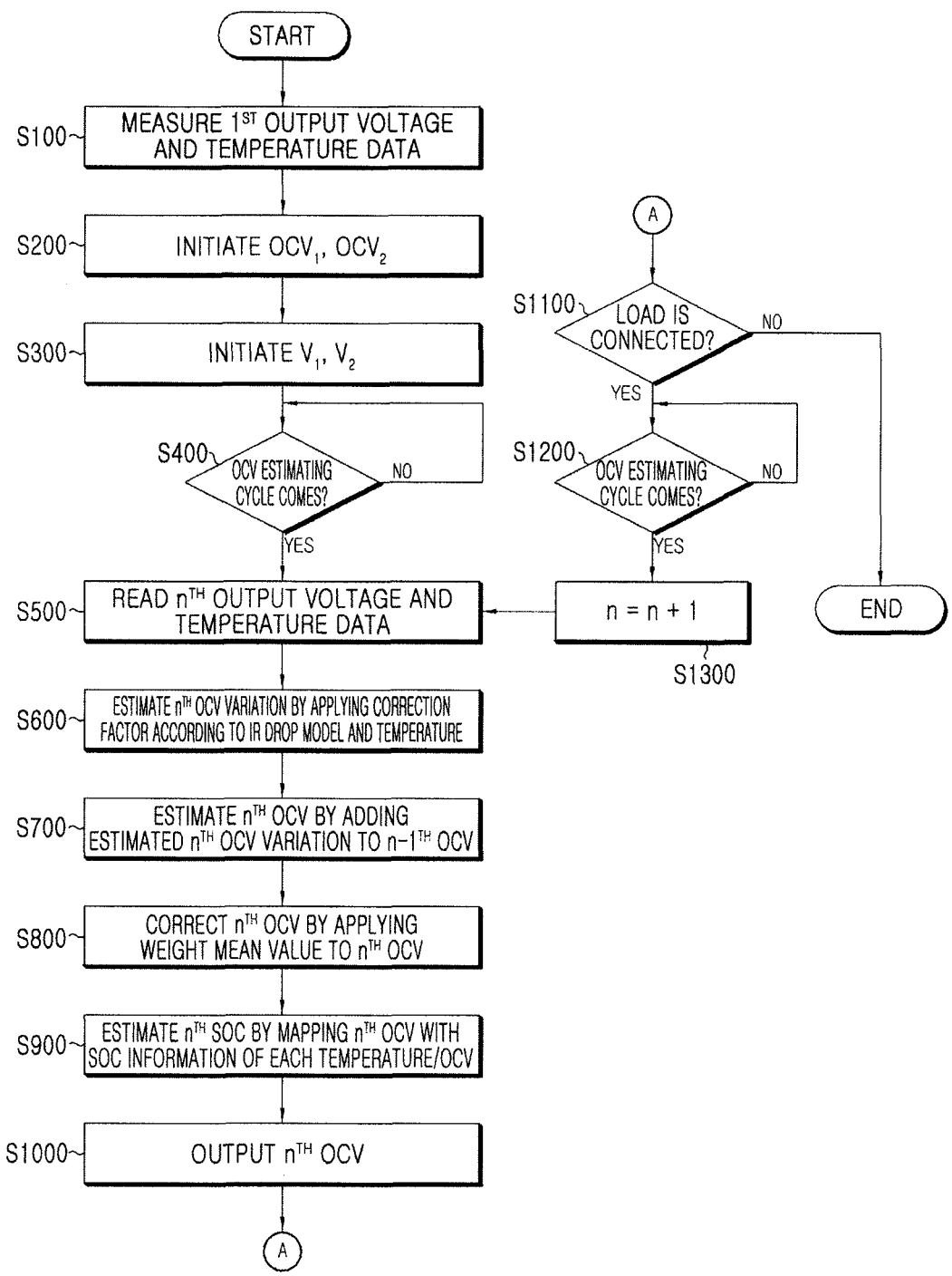
FIG. 3 is a flowchart illustrating a method for estimating OCV of a battery and a method for estimating SOC of a battery using the same according to an embodiment of the present invention.

FIG. 3 is a flowchart illustrating a method for estimating an OCV of a battery and a method for estimating SOC of a battery using the same according to the present invention.

First, in the step S100, a $1^{st}$ output voltage right before a load is connected to the battery is measured. Here, the $1^{st}$ output voltage is an output voltage in the state that a load is not connected to the battery, so it corresponds to a $1^{st}$ OCV.

In the step S200, the $1^{st}$ output voltage is allocated to a $1^{st}$ OCV ($OCV_1$) and a $2^{nd}$ OCV ($OCV_2$), thereby initiating the $1^{st}$ OCV ($OCV_1$) and the $2^{nd}$ OCV ($OCV_2$).

In the same way, in the step S300, the $1^{st}$ output voltage is allocated to a $1^{st}$ output voltage $V_1$ and a $2^{nd}$ output voltage $V_2$, thereby also initiating the $1^{st}$ output voltage $V_1$ and the $2^{nd}$ output voltage $V_2$.

In the step S400, it is determined whether a battery OCV estimating cycle comes. The OCV may be set arbitrarily.

The step S500 is executed when the OCV estimating cycle comes, and in the step S500, $n^{th}$ output voltage and temperature of the battery are read. In the step S500, n is allocated with 3.

In the step S600, a $n^{th}$ OCV variation is estimated using a battery output voltage varying pattern and a battery temperature. At the estimation of the $n^{th}$ OCV variation, the above equation 1 is used. Since n is 3, the varying pattern of the battery output voltage is a varying pattern of $3^{rd}$, $2^{nd}$ and $1^{st}$ output voltages. However, if n is 4 or greater, the varying pattern of output voltage may be a varying pattern for 4 or more output voltages.

In the step S700, the $n^{th}$ OCV variation is added to a $n-1^{th}$ OCV to estimate a $n^{th}$ OCV. Since n is 3 at the present, the step S700 is executed to estimate a $3^{rd}$ OCV by adding a $3^{rd}$ OCV variation to a $2^{nd}$ OCV.

The step S800 may be executed selectively, and it additionally corrects a $n^{th}$ OCV by calculating a weight mean value between a $n^{th}$ OCV and an OCV at the last stage and then adding a difference between the calculated weight mean value and a $n-1^{th}$ OCV to the calculated $n^{th}$ OCV. For calculation of the weight mean value, the above equation 3 may be used.

In the step S900, SOC of the battery corresponding to the estimated $n^{th}$ OCV and the temperature measured at the estimation of the $n^{th}$ OCV is mapped from the look-up table where the SOC information of each temperature and each OCV is recorded, thereby estimating $n^{th}$ SOC information of the battery.

In the step S1000, the estimated $n^{th}$ SOC information is output to the BMS. Then, the BMS may provide the SOC information of the battery to a user through a display or the like, or utilize the SOC information as data for controlling battery operations such as charge initiation or discharge stop of the battery.

In the step S1100, it is determined whether the load is still connected.

The step S1200 is executed when it is determined that the load is connected to the battery, and in the step S1200, it is determined whether a battery OCV cycle comes.

The step S1300 is executed when the battery OCV cycle comes, and the process progresses to the step S500 with the n value being increased by 1. Then, the processes of estimating a $n^{th}$ OCV variation, estimating a $n^{th}$ OCV by adding the estimated $n^{th}$ OCV variation to a $n-1^{th}$ OCV, correcting the $n^{th}$ OCV using a difference between the weight mean value of the output voltages and the $n-1^{th}$ OCV, estimating a $n^{th}$ battery SOC using the look-up table, and outputting the estimated SOC are repeated.

EXPERIMENTAL EXAMPLES

Hereinafter, experimental examples of the present invention will be explained in more detail. However, the experimental examples are just for illustration purpose, and the present invention is not limited thereto.

Experimental Example 1

In the experimental example 1, the apparatus for estimating SOC of a battery according to the present invention was mounted to an actual car. Also, a battery was charged and discharged by successively applying a car driving model according to UDDS (Urban Dynamometer Driving Cycle), HWFET (Highway Fuel Economy Driving Schedule), NYCC (New York City Cycle Driving Schedule) and US60 (Aggressive Driving Cycle), regulated by EPA (Environmental Protection Agency) considered as a standard for car test in the electric or hybrid car industry. Here, UDDS and NYCC are standardized car driving models for state change of a car when the car is running in an urban region, HWFET is a standardized car driving model for state change of a car when the car is running on a highway, and US60 is a standardized car driving model for state change of a car when the car is running at a high speed.

Figure 4:
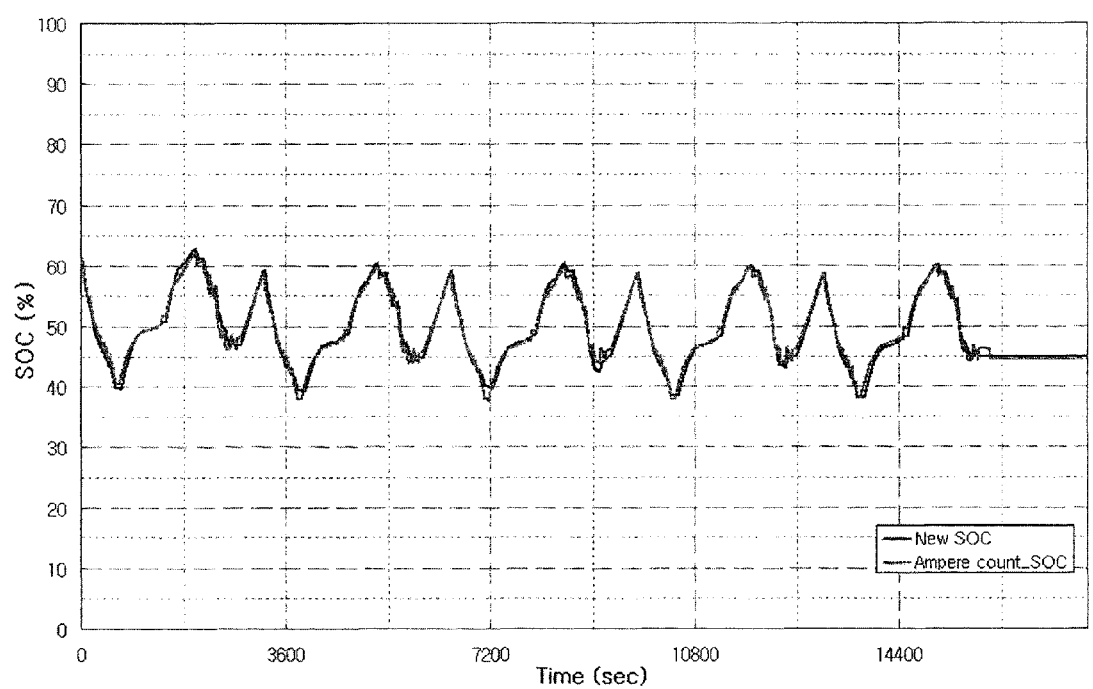
FIG. 4 is a graph comparatively showing SOC of a battery, estimated according to the method of the present invention, and SOC of a battery, estimated according to a conventional current integrating method, when a charging/discharging cycle of the experimental example 1 is applied.

FIG. 4 is a graph comparatively showing a SOC value estimated by the method of the present invention and a SOC value estimated by a conventional current accumulation method, when the charging/discharging cycle according to the experimental example 1 is applied.

Referring to FIG. 4, if SOC of a battery is estimated using the conventional current accumulation method, measurement errors of current are accumulated, so the profile of SOC progresses while shaking finely. However, it would be understood that SOC of a battery estimated according to the present invention gives a more stable SOC profile rather than the case of applying the current accumulation method. In this reason, it would be found that the present invention allows estimation of SOC of a battery in a more stable way in comparison to the conventional current accumulation method.

Figure 5:
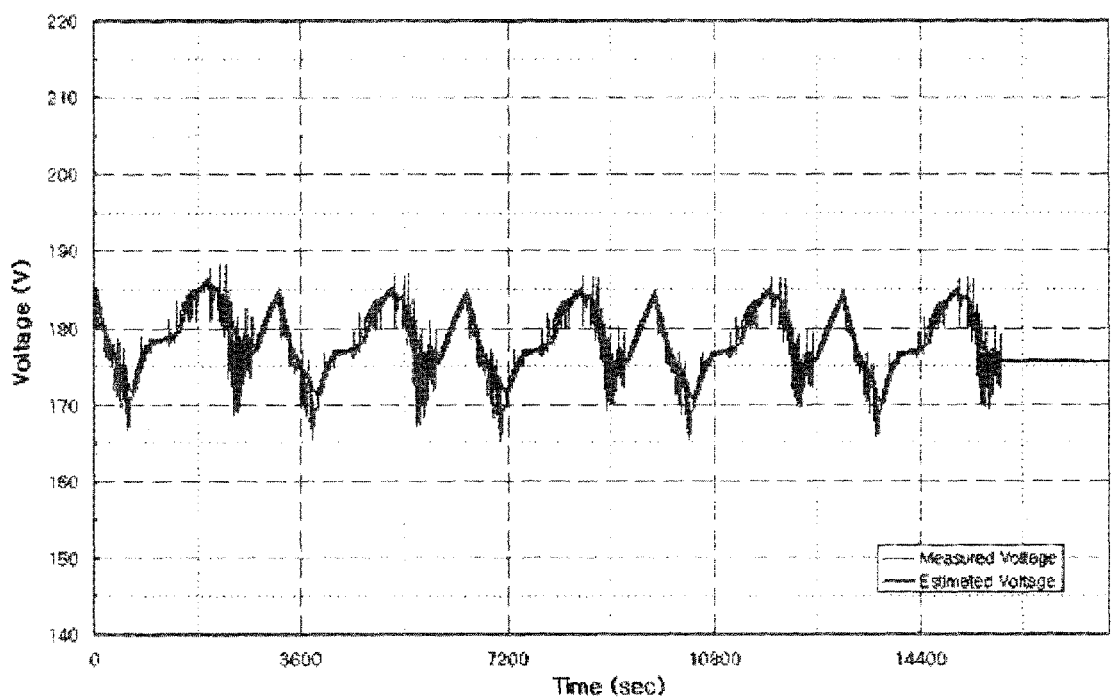
FIG. 5 is a graph comparatively showing OCV estimated according to the method of the present invention and a battery output voltage actually measured, in a charging/discharging cycle under conditions proposed in the experimental example 1.

FIG. 5 is a graph comparatively showing a battery OCV according to the present invention and an actually measured battery output voltage in the charging/discharging cycle proposed in the experimental example 1.

Referring to FIG. 5, it would be understood that, though the actually measured battery output voltage has an abruptly varying voltage pattern due to IR drop, the OCV estimated according to the present invention does not show an abrupt varying voltage pattern. In other words, according to the present invention, it is possible to obtain a stabilized OCV profile without IR drop effect, and thus it is possible to reduce an error of estimated value for SOC.

Experimental Example 2

In this experimental example 2, a charging/discharging cycle of a battery was set as 250 second interval and 500 second interval, respectively, under the same conditions as in the experimental example 1, and a silent period of 10 minutes was given whenever each charging/discharging cycle was terminated to wait until the output voltage of the battery comes to a stable state, and then the charging/discharging cycle was executed. The above process was repeatedly executed.

Figure 6:
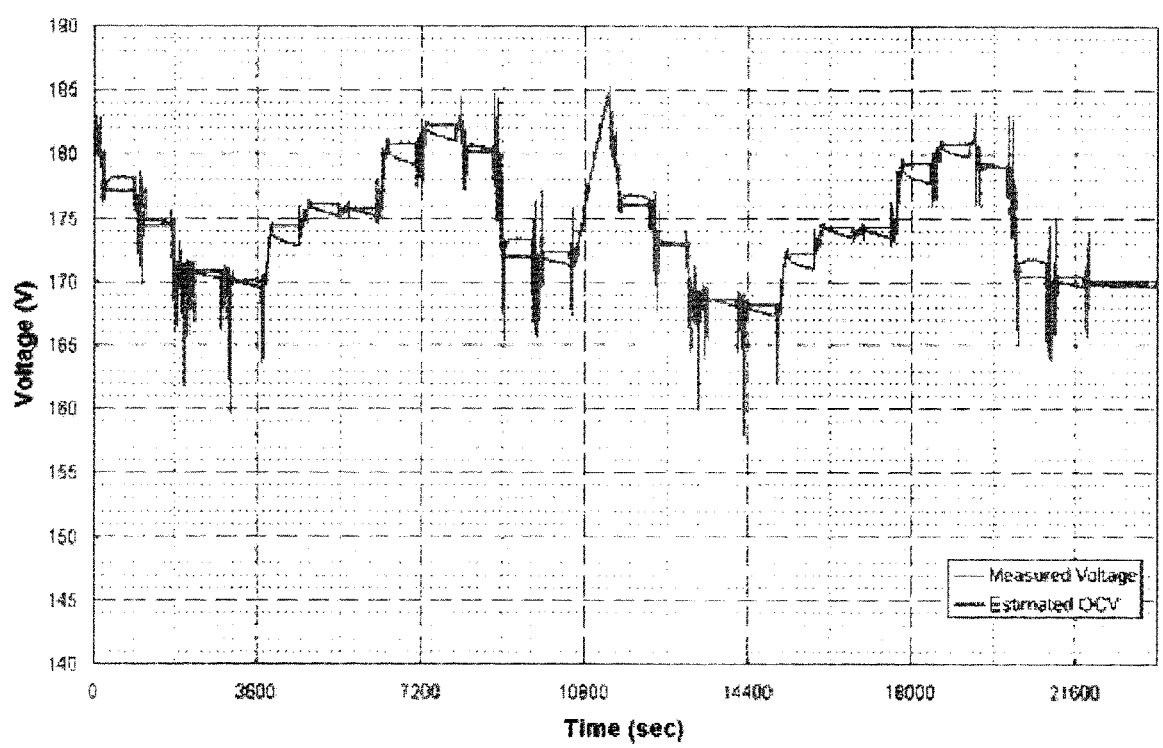
FIG. 6 a graph comparatively showing OCV estimated according to the method of the present invention and a battery output voltage actually measured, when a charging/discharging cycle of 250 seconds and a silent period of 10 minutes are set.
Figure 7:
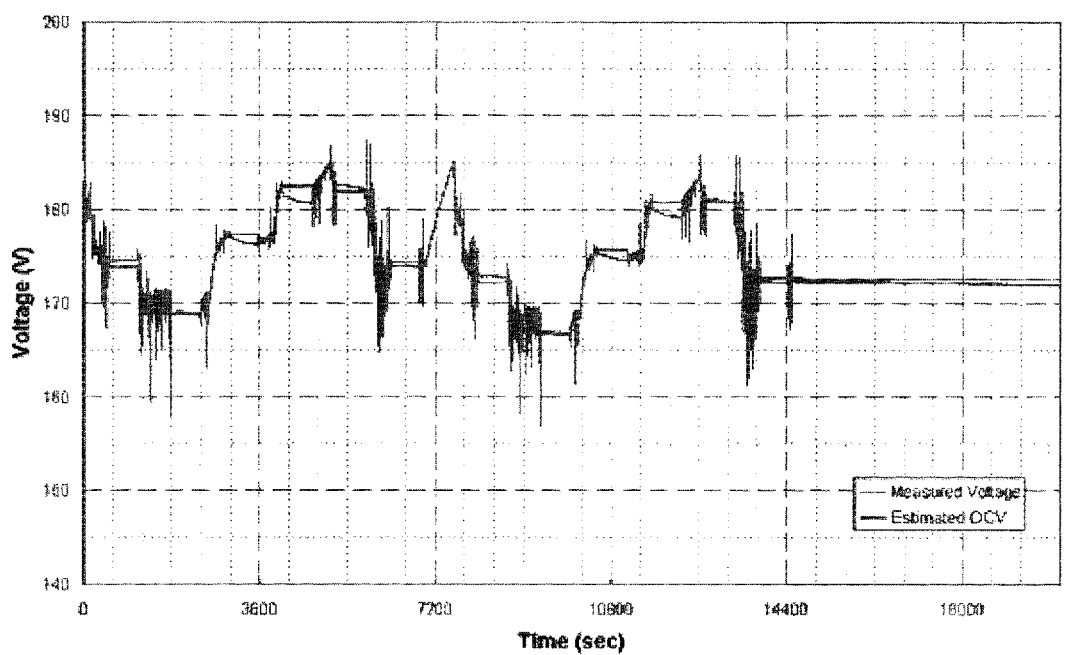
FIG. 7 is a graph comparatively showing OCV estimated according to the method of the present invention and a battery output voltage actually measured, when a charging/discharging cycle of 500 seconds and a silent period of 10 minutes are set.

FIG. 6 is a graph comparatively showing an OCV estimated according to the method of the present invention and an actually measured battery output voltage when a charging/discharging cycle of 250 seconds and a silent period of 10 minutes are set, and FIG. 7 is a graph comparatively showing an OCV estimated according to the method of the present invention and an actually measured battery output voltage when a charging/discharging cycle of 500 seconds and a silent period of 10 minutes are set.

Referring to FIGS. 6 and 7, though a silent period is provided between charging/discharging cycles to stabilize a voltage state of a battery, it would be understood that the method for estimating an OCV according to the present invention may eliminate IR drop effects. Thus, it can be confirmed once more that the present invention allows more accurate estimation of SOC of a battery.

FIG. 8 is a table showing battery temperatures, measured OCV, estimated OCV, differences (error values) between the measured OCV and the estimated OCV, measured SOC, estimated SOC, and differences (error values) between the measured SOC and the estimated SOC, obtained 38 times under the condition of the experimental example 2, in a comparative and analytic manner.

In FIG. 8, a charging/discharging cycle of 250 seconds and a silent period of 10 minutes are set in the cases 1 to 25, and a charging/discharging cycle of 500 seconds and a silent period of 10 minutes are set in the cases 26 to 38.

Through the analysis of the errors of OCV and the errors of SOC shown in FIG. 8, it is found that RMSE (Root Mean Square Error) is 1.4% and MAE (Mean Absolute Error) is 1.14%, which are much lower than allowable errors regulated in the related art.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

INDUSTRIAL APPLICABILITY

According to the present invention, it is possible to estimate more accurate SOC of a battery by estimating an OCV in a state that an error of battery output voltage generated by IR drop and temperature change is corrected. In particular, since SOC of a battery is estimated without using battery current, SOC of a battery can be estimated more accurately than a conventional current accumulation method. In addition, since the principle of estimating SOC of a battery is simple, a time taken for estimating SOC of a battery is short, and the hardware specification used for the estimation can be degraded, which allows cost reduction.

The invention claimed is:

1. An apparatus for estimating an OCV (Open Circuit Voltage) of a battery, comprising:
a voltage sensing unit for measuring an output voltage of a battery;
a temperature sensing unit for measuring a temperature of the battery;
a data storing unit for receiving the battery output voltage and the temperature data at time intervals from the voltage sensing unit and the temperature sensing unit and then storing the battery output voltage and the temperature data in a memory;
an OCV variation estimating unit for estimating an OCV variation from a varying pattern of battery output voltages measured in the past and at the present and the temperature data, stored in the memory, by applying a mathematical model that defines a correlation between the varying pattern of battery output voltages and the OCV variation and a correction factor corresponding to the battery temperature; and
an OCV estimating unit for estimating an OCV of the battery at the current stage by reflecting the estimated OCV variation on the OCV estimated at a last stage.

2. The apparatus according to claim 1,
wherein the OCV estimating unit corrects the OCV by adding a difference between a weight mean value for the battery output voltages of the past and the present and the OCV of the last stage to the estimated OCV of the current stage, the weight mean value being increased as a measurement point of the battery output voltage is earlier.

3. The apparatus according to claim 2,
wherein the battery output voltage of the past is a battery output voltage of the last stage.

4. The apparatus according to claim 1,
wherein the estimated OCV variation is calculated by multiplying a OCV variation calculated by applying the mathematical model with the correction factor.

5. The apparatus according to claim 1,
wherein the battery output voltage of the variation pattern includes at least battery output voltages ($V_n$, $V_{n-1}$ and $V_{n-2}$) measured at a current stage, a last stage and the stage before last.

6. The apparatus according to claim 1,
wherein the mathematical model is defined by mathematical operation between a battery output voltage variation between the current stage and the last stage and a pattern function defined by each output voltage of the battery output voltage varying pattern.

7. The apparatus according to claim 1,
wherein the correction factor is calculated by inputting the temperature of the battery into a mathematical model defining a battery temperature (T) as an input variable and a correction factor of the battery OCV variation as an output variable.

8. A method for estimating an OCV of a battery, comprising:
obtaining output voltage and temperature data of a battery at time intervals;
estimating an OCV variation from a varying pattern of battery output voltages measured at the present and in the past and the temperature data by applying a mathematical model that defines a correlation between the varying pattern of battery output voltages and the OCV variation and a correction factor corresponding to the battery temperature; and
estimating a battery OCV at the current stage by reflecting the estimated OCV variation on a battery OCV estimated at a last stage.

9. An apparatus for estimating SOC (State Of Charge) of a battery, comprising:
a voltage sensing unit for measuring an output voltage of a battery;
a temperature sensing unit for measuring a temperature of the battery;
a memory storing SOC of each temperature and each OCV;
a data storing unit for receiving the battery output voltage and the temperature data at time intervals from the voltage sensing unit and the temperature sensing unit and then storing the battery output voltage and the temperature data in a memory;
an OCV variation estimating unit for estimating an OCV variation from a varying pattern of battery output voltages measured in the past and at the present and the temperature data, stored in the memory, by applying a mathematical model that defines a correlation between the varying pattern of battery output voltages and the OCV variation and a correction factor corresponding to the battery temperature;
an OCV estimating unit for estimating an OCV of the battery at the current stage by reflecting the estimated OCV variation on the OCV estimated at a last stage; and
a SOC estimating unit for estimating SOC of the battery corresponding to the estimated OCV and the battery temperature and then outputting the SOC.

10. The apparatus according to claim 9,
wherein the OCV estimating unit corrects the OCV by adding a difference between a weight mean value for the battery output voltages of the past and the present and the OCV of the last stage to the estimated OCV of the current stage, the weight mean value being increased as a measurement point of the battery output voltage is earlier.

11. The apparatus according to claim 10, wherein the battery output voltage of the past is a battery output voltage of the last stage.

12. The apparatus according to claim 9, wherein the estimated OCV variation is calculated by multiplying a OCV variation calculated by applying the mathematical model with the correction factor.

13. The apparatus according to claim 9, wherein the battery output voltage of the variation pattern includes at least battery output voltages ($V_n$, $V_{n-1}$ and $V_{n-2}$) measured at a current stage, a last stage and the stage before last.

14. The apparatus according to claim 9, wherein the mathematical model is defined by mathematical operation between a battery output voltage variation between the current stage and the last stage and a pattern function defined by each output voltage of the battery output voltage varying pattern.

15. The apparatus according to claim 9, wherein the correction factor is calculated by inputting the temperature of the battery into a mathematical model defining a battery temperature (T) as an input variable and a correction factor of the battery OCV variation as an output variable.

16. The apparatus according to claim 9, wherein the SOC estimating unit estimates the SOC of the battery corresponding to the estimated OCV and the battery temperature by referring to SOC information of each temperature and each OCV and then outputting the SOC.

17. A method for estimating SOC of a battery, comprising:
storing SOC information of each temperature and each OCV;
obtaining output voltage and temperature data of a battery at time intervals;
estimating an OCV variation from a varying pattern of battery output voltages measured at the present and in the past and the temperature data by applying a mathematical model that defines a correlation between the varying pattern of battery output voltages and the OCV variation and a correction factor corresponding to the battery temperature;
estimating a battery OCV at the current stage by reflecting the estimated OCV variation on a battery OCV estimated at a last stage; and
mapping SOC of the battery corresponding to the estimated OCV and the battery temperature by referring to SOC information of each temperature and each OCV and then outputting the SOC.

18. A hardware module for estimating an OCV of a battery, which executes:
a process of estimating an OCV variation from a varying pattern of battery output voltages measured at the present and in the past and the temperature data by applying a mathematical model that defines a correlation between the varying pattern of battery output voltages and the OCV variation and a correction factor corresponding to the battery temperature; and
a process of estimating a battery OCV at the current stage by reflecting the estimated OCV variation on a battery OCV estimated at a last stage.

19. A hardware module for estimating SOC of a battery, which executes:
a process of estimating an OCV variation from a varying pattern of battery output voltages measured at the present and in the past and the temperature data by applying a mathematical model that defines a correlation between the varying pattern of battery output voltages and the OCV variation and a correction factor corresponding to the battery temperature; and
a process of estimating a battery OCV at the current stage by reflecting the estimated OCV variation on a battery OCV estimated at a last stage; and
a process unit for a SOC estimating unit for estimating SOC of the battery corresponding to the estimated OCV and the battery temperature and then outputting the SOC.

* * * * *